United States Patent
Huang (10) Patent No.: US 9,105,491 B2
(45) Date of Patent: Aug. 11, 2015

(54) SEMICONDUCTOR STRUCTURE AND SEMICONDUCTOR DEVICE HAVING THE SAME

(71) Applicant: Tsung-Yi Huang, HsinChu (TW)

(72) Inventor: Tsung-Yi Huang, HsinChu (TW)

(73) Assignee: Richtek Technology Corporation, Chupei, HsinChu (TW)

( * ) Notice: Subject to any disclaimer, the term of this patent is extended or adjusted under 35 U.S.C. 154(b) by 0 days.

(21) Appl. No.: 14/041,336

(22) Filed: Sep. 30, 2013

(65) Prior Publication Data
US 2015/0091104 A1 Apr. 2, 2015

(51) Int. Cl.
*H01L 29/66* (2006.01)
*H01L 29/06* (2006.01)
*H01L 29/78* (2006.01)

(52) U.S. Cl.
CPC ............ *H01L 29/0684* (2013.01); *H01L 29/78* (2013.01)

(58) Field of Classification Search
CPC ............ H01L 27/0928; H01L 27/0922; H01L 29/0684; H01L 29/78
USPC ......... 257/409, 500, 499, 544, 546, 355, 367, 257/408, 487
See application file for complete search history.

(56) References Cited

U.S. PATENT DOCUMENTS

| | | | |
|---|---|---|---|
| 5,017,996 A * | 5/1991 | Yasuoka | 257/370 |
| 2001/0035557 A1 * | 11/2001 | Park et al. | 257/371 |
| 2002/0036328 A1 * | 3/2002 | Richards et al. | 257/401 |
| 2009/0127660 A1 * | 5/2009 | Kim et al. | 257/578 |
| 2010/0117150 A1 * | 5/2010 | Pendharkar et al. | 257/337 |
| 2012/0256252 A1 * | 10/2012 | Gui et al. | 257/329 |
| 2014/0315358 A1 * | 10/2014 | Huang et al. | 438/196 |

* cited by examiner

*Primary Examiner* — Daniel Whalen
*Assistant Examiner* — Aneta Cieslewicz
(74) *Attorney, Agent, or Firm* — Tung & Associates (57) ABSTRACT

The invention provides a semiconductor structure and a semiconductor device having such semiconductor structure. The semiconductor structure includes: a substrate; a first well having a first conductivity type, which is provided on the substrate; a second well having a second conductivity type and contacting the first well at a boundary in between in a lateral direction; and a plurality of mitigation regions having the first conductivity type or the second conductivity type, provided in the first well and being close to the boundary in a lateral direction and penetrating the first well in a vertical direction.

12 Claims, 7 Drawing Sheets

017
SEMICONDUCTOR STRUCTURE AND SEMICONDUCTOR DEVICE HAVING THE SAME

BACKGROUND OF THE INVENTION

1. Field of Invention

The present invention relates to a semiconductor structure and a semiconductor device having the semiconductor structure, especially a semiconductor structure including a plurality of mitigation regions to broaden its operation voltage range and a semiconductor device having the semiconductor structure.

2. Description of Related Art

Figure 1A:
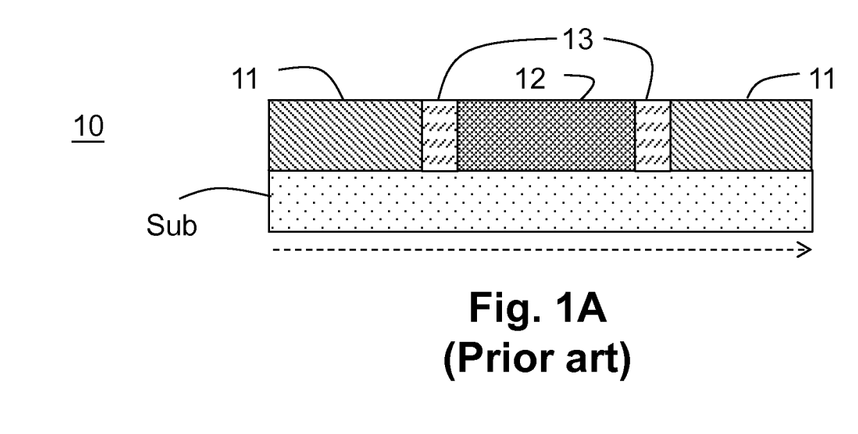
FIGS. 1A and 1B show two prior art the semiconductor structures.

FIG. 1A shows a prior art semiconductor structure 10, wherein at least one first conductivity type well 11 and at least one second conductivity type well 12 are provided on a substrate Sub and adjacent to each other in a lateral direction indicated by a dash arrow line shown in FIG. 1A. A semiconductor device is formed in each of the first conductivity type well 11 and the second conductivity type well 12, such as a MOS transistor, BJT transistor, JFET transistor, etc., which are not shown in the figure. At least one interface region 13 is formed at the boundary between the first conductivity type well 11 and the second conductivity type well 12; the interface region 13 is a region where the first conductivity type well 11 overlaps the second conductivity type well 12. The first conductivity type well 11 and the second conductivity type well 12 are formed in an epitaxial layer on the substrate Sub. The first conductivity type well 11 is for example an N-type well and the second conductivity type well 12 is for example a P-type well; however, the first conductivity type well 11 can be a P-type well and the second conductivity type well 12 can be an N-type well. Note that the numbers of the first conductivity type well 11 and the second conductivity type well 12 and their relative positions shown in FIG. 1A are for illustrative purpose only.

Figure 1B:
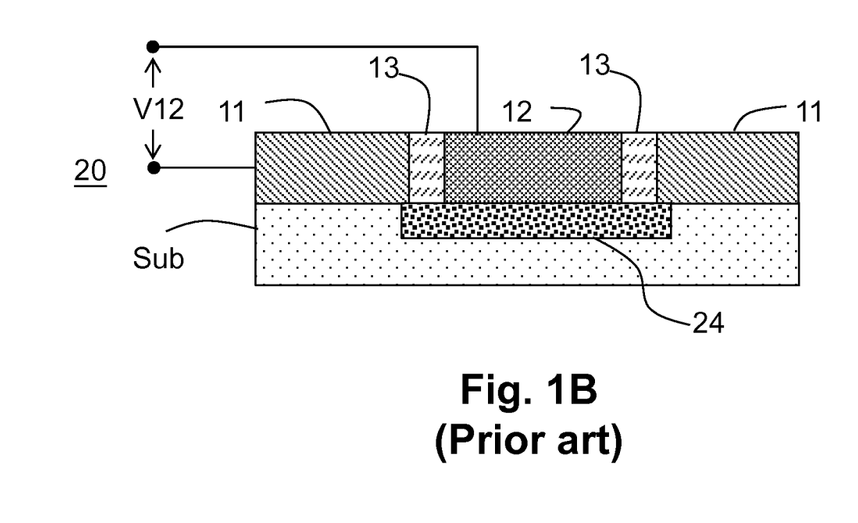

When the semiconductor structure 10 is used in a high voltage device, one of the conductivity type wells such as the second conductivity type well 12 can be used to form the high voltage device, and the operation voltage range of the high voltage device is related to the breakdown voltage between the first conductivity type well 11 and the second conductivity type well 12 and the breakdown voltage between the second conductivity type well 12 and the substrate Sub. If the operation voltage is too high and the breakdown voltage is low, an electrical punch-through could penetrate the boundary between the first conductivity type well 11 and the second conductivity type well 12. FIG. 1B shows a prior art semiconductor structure 20, which includes a substrate Sub, a first conductivity type well 11, a second conductivity type well 12, an interface region 13 therebetween, and a barrier layer 24 disposed between the second conductivity type well 12 and the substrate Sub. The barrier layer 24 is provided to increase the breakdown voltage between the second conductivity type well 12 and the substrate Sub, whereby the breakdown voltage between the first conductivity type well 11 and the second conductivity type well 12 is also improved. However, the electrical punch-through may still occur to cause failure if the breakdown voltage between the first conductivity type well 11 and the second conductivity type well 12 is not high enough. The interface regions 13 shown in FIGS. 1A and 1B can improve a little of the breakdown voltage, which is not enough. Hence, it is desired to improve the breakdown voltage by a simple and effective way.

SUMMARY OF THE INVENTION

In a perspective of the present invention, a semiconductor structure is provided. The semiconductor structure includes a substrate, a first well having a first conductivity type, a second well having a second conductivity type, and a plurality of mitigation regions, wherein the second conductivity type is opposite to the first conductivity type. The first well having the first conductivity type is provided on the substrate. The second well having the second conductivity type contacts the first well at a boundary in between in a lateral direction. The mitigation regions have the first conductivity type or the second conductivity type, provided in the first well and being close to the boundary in a lateral direction and penetrating the first well in a vertical direction The mitigation regions have the first conductivity type or the second conductivity type. The mitigation regions are provided in the first well and close to a boundary of the first well in a lateral direction, and penetrate the first well in a vertical direction. In one embodiment, the first well and the second well are formed in an epitaxial silicon layer on the substrate. In another embodiment, any of the mitigation regions does not contact the boundary, and the mitigation regions do not contact each other.

In one embodiment, the semiconductor structure further includes mitigation regions have the first conductivity type or the second conductivity type, provided in the second well.

In one embodiment, the semiconductor structure further includes a barrier layer having the second conductivity type formed between the first well and the substrate to separate the first well and the substrate. The semiconductor structure preferably further includes at least one barrier mitigation region in the barrier layer, the at least one barrier mitigation region being close to the boundary in the lateral direction and penetrating the barrier layer in a vertical direction.

In another perspective of the present invention, a semiconductor device is provided. The semiconductor device includes a semiconductor structure, a gate, a source and a drain, wherein the semiconductor structure includes a substrate, a first well, a second well, and a plurality of mitigation regions. The first well has a first conductivity type and is provided on the substrate. The second well having a second conductivity type opposite to the first conductivity type; the second well contacts the first well at a boundary in between in a lateral direction. The mitigation regions have the first conductivity type or the second conductivity type, and are provided in the first well and close to the boundary in a lateral direction. The mitigation regions penetrate the first well in the vertical direction from a cross-section view. The source and the drain are formed in the first well at two sides of the gate.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, but not drawn according to actual scale. The orientation wordings in the description such as: above, under, left, or right are for reference with respect to the drawings, but not for limiting the actual product made according to the present invention.

Figure 2A:
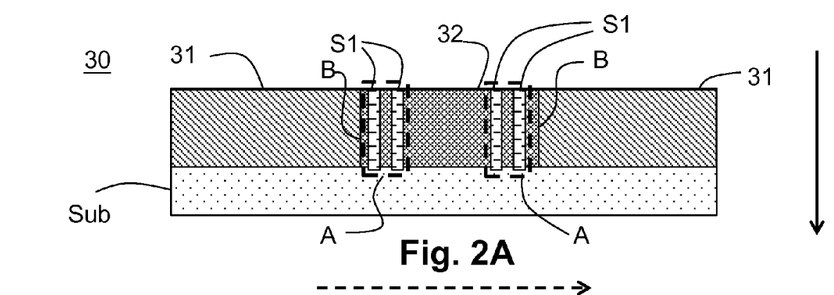
FIGS. 2A, 2B, 2C, 3A, 3B, 3C, 4A, 4B, 4C, and 5 show embodiments of the semiconductor structures according to the present invention.
Figure 2B:
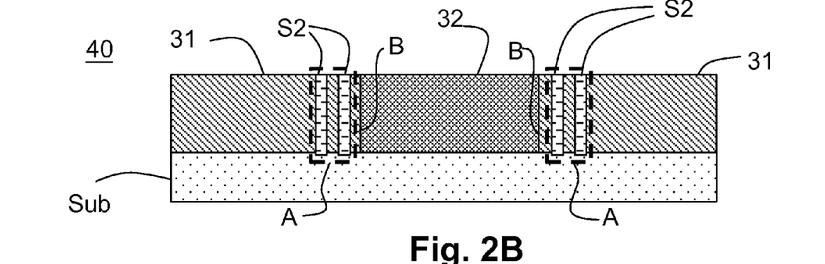

FIG. 2A shows a semiconductor structure 30 according to a perspective of the present invention, which includes a substrate Sub, a first conductivity type well 31, a second conductivity type well 32, and a plurality of mitigation regions S1, wherein the second conductivity type is opposite to the first conductivity type. The first conductivity type well 31 and the second conductivity type well 32 are provided on the substrate Sub, and the second conductivity type well 32 is adjacent to the first conductivity type well 31 in a lateral direction as indicated by a dash arrow line shown in FIG. 2A. At least one semiconductor device (such as a MOS transistor, BJT transistor, JFET transistor, etc. which is not shown) is formed in the first conductivity type well 31 or the second conductivity type well 32, or one device is formed which includes both the first conductivity type well 31 and the second conductivity type well 32. The mitigation regions S1 are provided in, for example but not limited to, the second conductivity type well 32. The mitigation regions S1 are close to a boundary B of the second conductivity type well 32 in the lateral direction, that is, the mitigation regions S1 are in a neighboring area A which is close to the boundary B. The mitigation regions S1 penetrate the second conductivity type well 32 in a vertical direction as indicated by a solid arrow line shown in FIG. 2A. Any of the mitigation regions S1 does not contact the boundary B, and the mitigation regions do not contact each other. Referring to the semiconductor structure 40 as shown in FIG. 2B, in another embodiment, the mitigation regions S2 are provided in the neighboring area A in the first conductivity type well 31. Any of the mitigation regions S2 does not contact the boundary B and the mitigation regions S2 do not contact each other. In the semiconductor structures 30 and 40, potential barriers formed by the mitigation regions S1 and S2 can increase the breakdown voltage between the first conductivity type well 31 and the second conductivity type well 32, whereby an operation voltage range of a semiconductor device formed in these wells can be improved. In one embodiment, the formed semiconductor device is a CMOS device which includes both the first conductivity type well 31 and the second conductivity type well 32; the operation voltage range of the CMOS device is increased due to the improvement of the breakdown voltage.

Figure 2C:
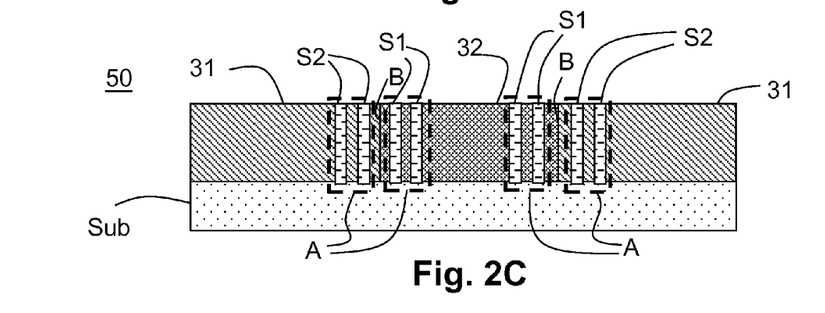

FIG. 2C shows a semiconductor structure 50, wherein the mitigation regions S1 and S2 are provided in both the second conductivity type well 32 and the first conductivity type well 31, in the neighboring regions A close to the boundary B in the lateral direction. By providing the mitigation regions S1 and S2 in both the second conductivity type well 32 and the first conductivity type well 31, the breakdown voltage can be increased.

In the aforementioned embodiments, the numbers of the mitigation regions S1 and S2 are not limited to the numbers as shown in the figures. For example, when the requirement for the breakdown voltage is lower, two mitigation regions S1 or S2 can be provided, each near a respective boundary B; when the breakdown voltage requirement is higher, the number of the mitigation regions S1 or S2 can be increased to such as three, four, or even higher, or both mitigation regions S1 and S2 can be provided.

In one embodiment, the mitigation region S2 which is provided in the first conductivity type well 31 is the first conductivity type and has a lower doping concentration than the first conductivity type well 31. The lower first conductivity type doping concentration can be formed for example as follows: first, masking the mitigation region S2 in a semiconductor substrate doping process; thereafter, diffusing the impurities in the first conductivity type well 31 from two sides of the mitigation region S2 by thermal treatment to form the lower doping concentration. The mitigation region S2 can be formed in an epitaxial silicon layer or in a layer having a similar property as the substrate material. In another embodiment, the mitigation region S2 can be formed by doping or counter-doping second conductivity type impurities. Similar to the mitigation regions S2, the mitigation region S1 provided in the second conductivity type well 32 has a lower second conductivity type doping concentration than the doping concentration of the second conductivity type well 32, and can be formed similarly. The mitigation region S1 also can be formed in an epitaxial silicon layer or in a layer having a similar property as the substrate material. The mitigation region S1 can be formed by masking it and thermal diffusion afterward, or formed by doping or counter-doping first conductivity type impurities.

Figure 3A:
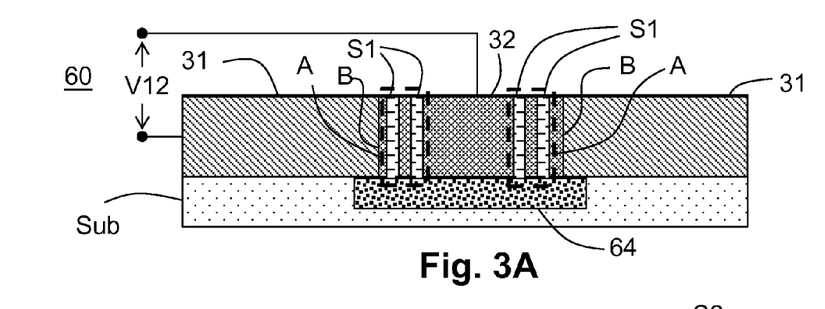
Figure 3B:
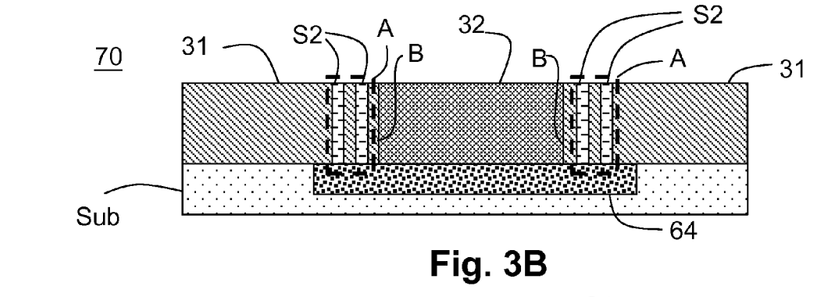
Figure 3C:
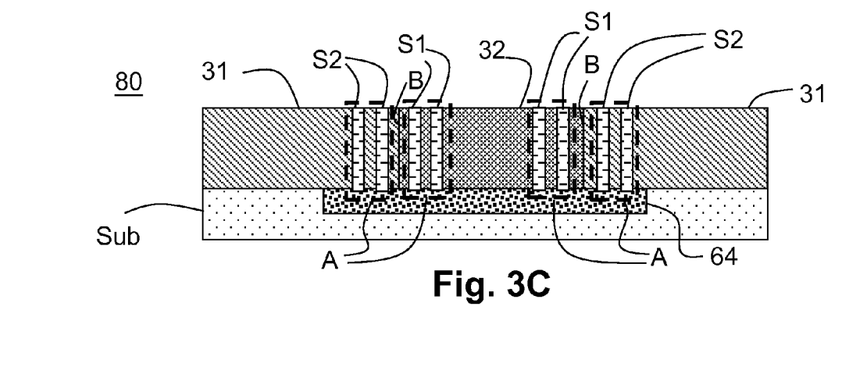

FIG. 3A shows a semiconductor structure 60 of an embodiment according to the present invention. Compared with FIG. 2A, the semiconductor structure 60 further includes a barrier layer 64 formed between the second conductivity type well 32 and the substrate Sub, to separate the second conductivity type well 32 and the substrate Sub for further increasing the breakdown voltage between the second conductivity type well 32 and the substrate Sub. In one embodiment, the barrier layer 64 is a first conductivity type barrier layer, that is, a barrier layer doped with first conductivity type impurities. FIGS. 3B and 3C are similar to FIGS. 2B and 2C, but the semiconductor structures 70 and 80 are provided with barrier layers 64. The barrier layers 64 are provided between the second conductivity type well 32 and the substrate Sub, to separate the second conductivity type well 32 and the substrate Sub for further increasing the breakdown voltage between the substrate Sub and the second conductivity type well 32.

Figure 4A:
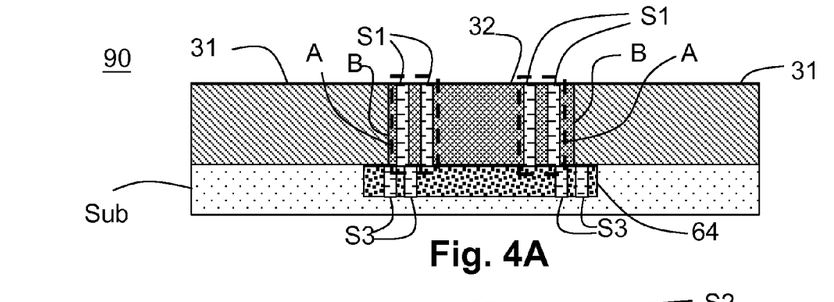
Figure 4B:
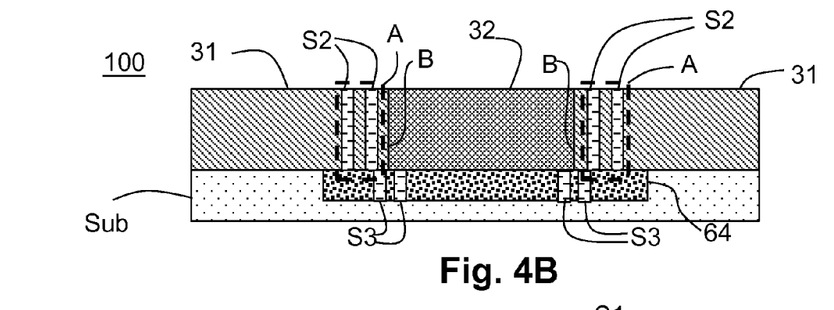
Figure 4C:
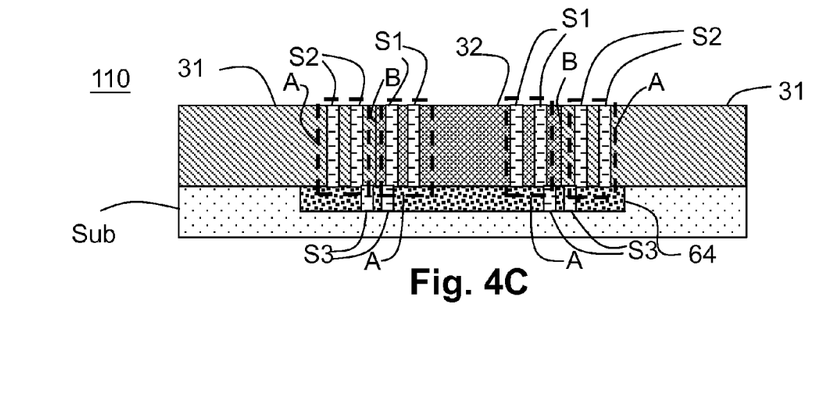

FIGS. 4A, 4B, and 4C are similar to FIGS. 3A, 3B, and 3C, but the barrier layers 64 in FIGS. 4A, 4B, and 4C further include at least one barrier mitigation region S3 which is provided in the barrier layer 64 close to the boundary B in the lateral direction and penetrates the barrier layer 64 in a vertical direction. This arrangement of the barrier mitigation region S3 further increases the breakdown voltage. Similar to mitigation regions S1 and S2, the barrier mitigation region S3 creates the potential barrier and increases the breakdown voltage. Note that the number of the barrier mitigation regions S3 is not limited to the number as shown in the figure; the number of the barrier mitigation regions S3 can be modified as desired. In one embodiment, the barrier mitigation region is the first conductivity type and has a lower doping concentration than the doping concentration of the first conductivity type well. In another embodiment, the barrier mitigation region has the second conductivity type.

Figure 5:
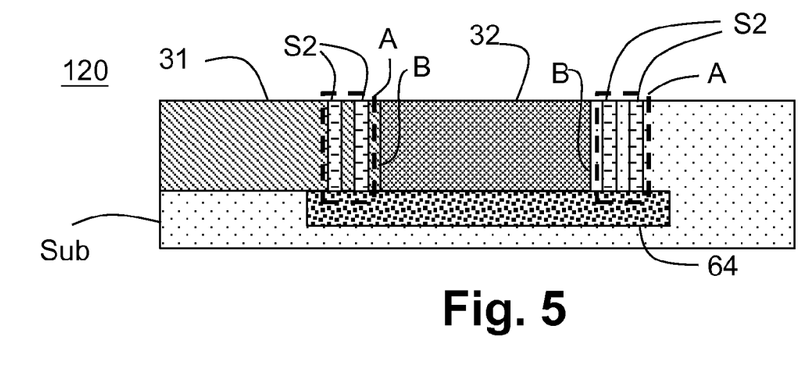

FIG. 5 shows an embodiment of the semiconductor structure 120 according to the present invention. The major difference between the semiconductor structure 120 and the aforementioned embodiments is that the second conductivity type well 32 contacts the first conductivity type well 31 at one side and contacts the substrate Sub at another side. According to the FIG. 5, the mitigation regions S2 can be provided in the substrate Sub and in the first conductivity type well 31, to increase the breakdown voltage. The substrate Sub for example can be the first conductivity type and its doping concentration is lower than the first conductivity type well 31.

Figure 6:
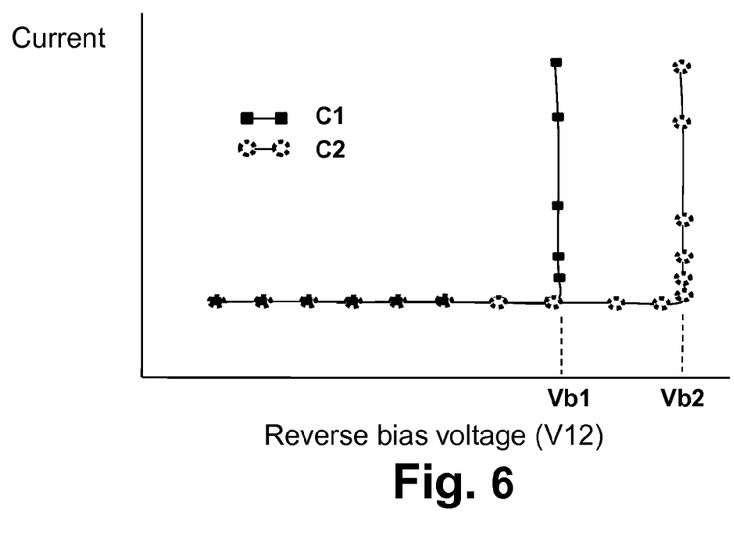
FIG. 6 shows breakdown voltage characteristic curves of the semiconductor structures according to the prior art and the present invention, respectively.

FIG. 6 shows the breakdown voltage characteristic curves of the semiconductor structures according to the prior art and the present invention, wherein the vertical coordinate indicates current and the horizontal coordinate indicates a reverse bias voltage V12 between the first conductivity type well and the second conductivity type well. Please refer to FIG. 6 and FIG. 1B, the characteristic curve C1 indicates the currents corresponding to various reverse bias voltages between the first conductivity type well 11 and the second conductivity type well 12. Please refer to FIG. 3A, the characteristic curve C2 indicates the currents corresponding to various reverse bias voltages between the first conductivity type well 31 and the second conductivity type well 32. It can be readily found by comparing the characteristic curves C1 and C2 that the threshold point Vb2 (breakdown voltage) of the characteristic curve C2 is much higher than the threshold point Vb1 (breakdown voltage) of the characteristic curve C1. This difference is contributed by the mitigation regions. Thus, the mitigation regions can increase the breakdown voltage, whereby the operation voltage range of the high voltage device can be increased.

Figure 7:
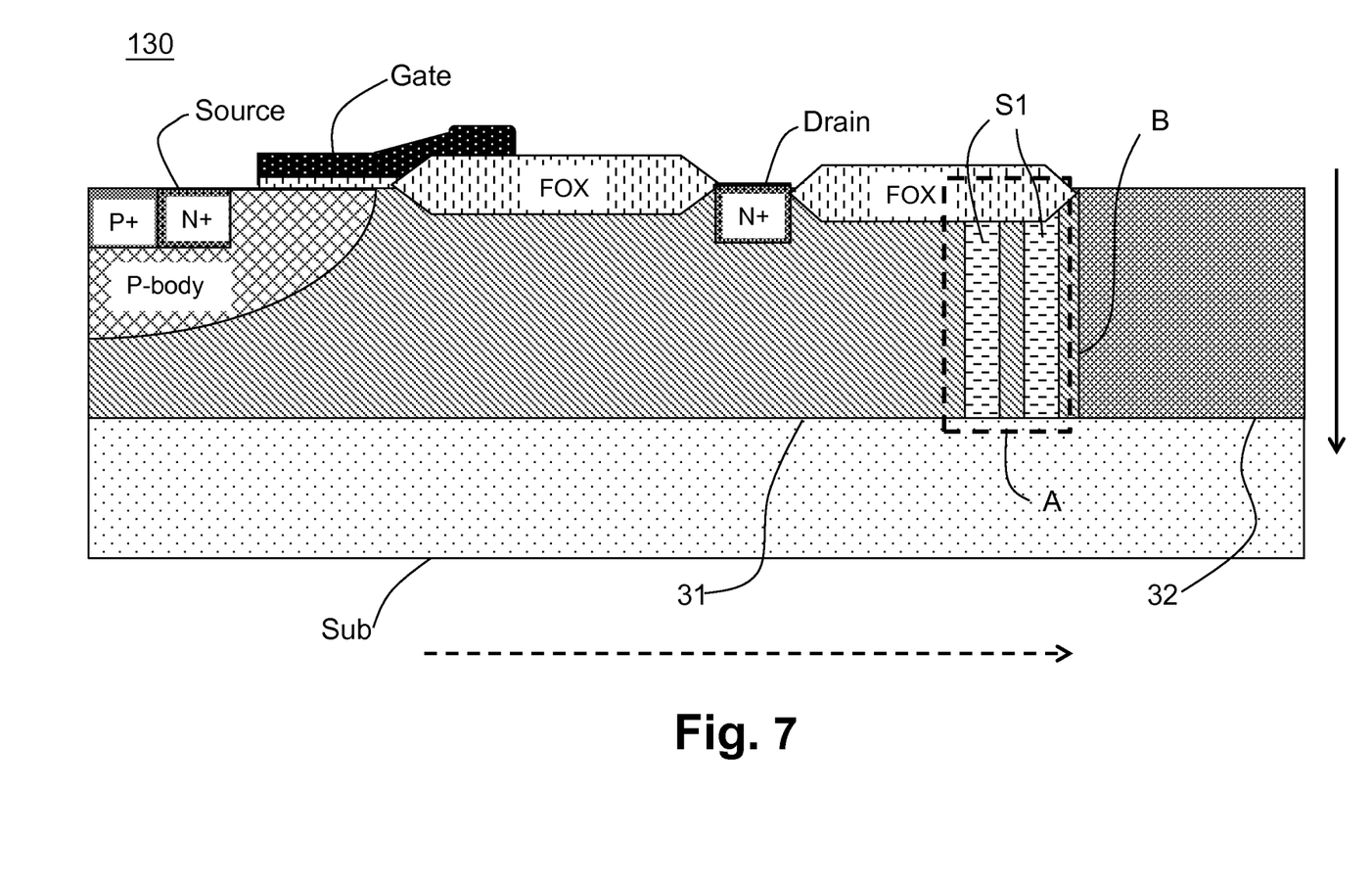
FIGS. 7 and 8 show two preferable embodiments of the semiconductor devices according to the present invention.
Figure 8:
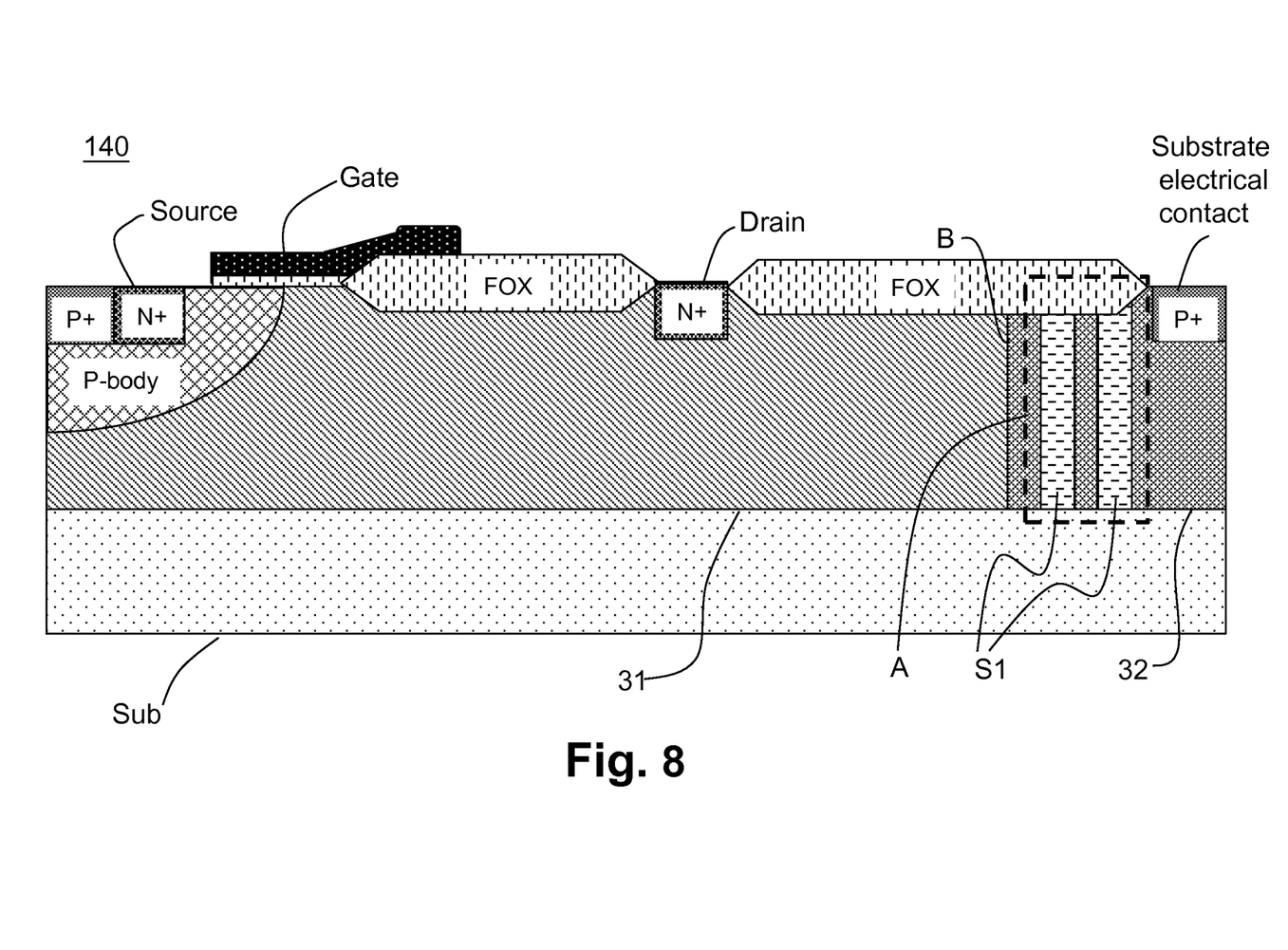

FIGS. 7 and 8 show two embodiments of the semiconductor devices according to the present invention.

FIG. 7 shows a semiconductor device 130 according to an embodiment of the present invention. The semiconductor device 130 includes a substrate Sub, a first conductivity type well (such as N-type well) 31, a second conductivity type well (such as P-type well) 32, a plurality of mitigation regions S1, a gate, field oxide regions FOX, a body region P-body, a body electrode (such as a P-type doping region P+), a source (such as an N-type doping region N+), and a drain (such as an N-type doping region N+); the right field oxide region, the body region, and the body electrode can be omitted in certain other embodiments. The first conductivity type well 31 is provided on the substrate Sub. The plural mitigation regions S1 are provided in the first conductivity type well 31 and close to a boundary B of the first conductivity type well 31 in a lateral direction (indicated by a dash arrow line in the figure). The plural mitigation regions S1 penetrate the first conductivity type well 31 in a vertical direction (indicated by a solid arrow line in FIG. 7) from a cross-section view. The first conductivity type well 31 and the second conductivity type well (such as P-type well) 32 contact each other at the boundary B in the lateral direction. The second conductivity type is an opposite conductivity type to the first conductivity type. The mitigation regions S1 have the first conductivity type or the second conductivity type. The gate is formed on the first conductivity type well 31. The source and the drain are respectively formed at two sides of the gate in the first conductivity type well 31. The mitigation regions S1 increase the operation voltage range of the semiconductor device 130.

In the embodiment shown in FIG. 7, additional mitigation regions can be provided in the second conductivity type well 32 and close to the boundary B. In a different embodiment, the semiconductor device 130 can be formed in the second conductivity type well 32. In fact, any of the embodiments in FIGS. 2A-2C, 3A-3C and 4A-4C can be applied to the semiconductor device 130 in FIG. 7.

FIG. 8 shows a semiconductor device 140 according to another embodiment of the present invention. The major difference between the FIG. 8 and FIG. 7 is that the semiconductor device 140 further includes a substrate electrical contact formed in the second conductivity type well 32, and the mitigation regions S1 are provided in the second conductivity type well 32 and close to the boundary B in the lateral direction. This embodiment is to explain that the semiconductor device of the present invention can include both the first conductivity type well 31 and the second conductivity type well 32 and is not limited to being formed in only one of the first conductivity type well 31 and the second conductivity type well 32. Note that any of the embodiments in FIGS. 2A-2C, 3A-3C and 4A-4C can be applied to the semiconductor device 140 in FIG. 8.

The manufacturing process for forming the aforementioned mitigation regions or the barrier mitigation regions is similar to the process wherein no mitigation regions and barrier mitigation region are to be formed. The difference is only in that the mask for defining the doping regions should take into consideration the mitigation regions and/or the barrier mitigation regions. The required equipment is the same. In comparison with the prior art, the present invention can greatly increase the breakdown voltage and improve the operation voltage range by a simple process modification.

In the aforementioned embodiments, the first conductivity type well and the second conductivity type well are shown to have a clear boundary B in between and the neighboring area A is close to this boundary B. In other embodiments, the first conductivity type well and the second conductivity type well can overlap each other and boundary B becomes an overlapping region instead of a clear boundary line. In this case, the present invention can still apply and the "neighboring area A" is close to this overlapping region (still referred to as "boundary B") of the first conductivity type well and the second conductivity type well.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a shallow trench isolation can be inserted between the first conductivity type well and second conductivity type well, or a circuit or device which does not affect the primary function can be inserted between the first and second conductivity type wells. Therefore, all these and other modifications should fall within the scope of the present invention. An embodiment or a claim of the present invention does not need to attain or include all the objectives, advantages or features described in the above. The abstract and the title are provided for assisting searches and not to be read as limitations to the scope of the present invention.

What is claimed is:

1. A semiconductor structure, comprising:
   a substrate;
   a first well having a first conductivity type, provided on the substrate;
   a second well having a second conductivity type and contacting the first well at a boundary in between in a lateral direction, the second conductivity type being opposite to the first conductivity type; and
   a plurality of first mitigation regions having the first conductivity type with a doping concentration lower than a doping concentration of the first well, provided in the first well and being close to the boundary in a lateral direction and penetrating through the first well from an upper side of the first well to reach a lower side of the first well in a vertical direction.

2. The semiconductor structure of claim 1, wherein the first well and the second well are formed in an epitaxial silicon layer on the substrate.

3. The semiconductor structure of claim 1, wherein any of the first mitigation regions does not contact the boundary, and the first mitigation regions do not contact each other.

4. The semiconductor structure of claim 1, further comprising a plurality of second mitigation regions having the first conductivity type or the second conductivity type, provided in the second well and being close to the boundary in a lateral direction and penetrating the second well in a vertical direction.

5. The semiconductor structure of claim 4, wherein any of the second mitigation regions does not contact the boundary, and the second mitigation regions do not contact each other.

6. A semiconductor device, comprising:
a semiconductor structure, comprising:
a substrate;
a first well having a first conductivity type, provided on the substrate;
a second well having a second conductivity type and contacting the first well at a boundary in between in a lateral direction, the second conductivity type being opposite to the first conductivity type; and
a plurality of mitigation regions having the first conductivity type with a doping concentration lower than a doping concentration of the first well, provided in the first well and being close to the boundary in a lateral direction and penetrating through the first well from an upper side of the first well to reach a lower side of the first well in a vertical direction;
a gate, formed on the first well; and
a source and a drain, respectively formed in the first well and at two sides of the gate.

7. The semiconductor device of claim 6, wherein the first well and the second well are formed in an epitaxial silicon layer on the substrate.

8. The semiconductor device of claim 6, wherein any of the mitigation regions does not contact the boundary, and the mitigation regions do not contact each other.

9. The semiconductor device of claim 6, further comprising a plurality of second mitigation regions having the first conductivity type or the second conductivity type, provided in the second well and being close to the boundary in a lateral direction and penetrating the second well in a vertical direction.

10. The semiconductor device of claim 9, wherein any of the second mitigation regions does not contact the boundary, and the second mitigation regions do not contact each other.

11. A semiconductor structure, comprising:
a substrate;
a first well having a first conductivity type, provided on the substrate;
a second well having a second conductivity type and contracting the first well at a boundary in between in a lateral direction, the second conductivity type being opposite to the first conductivity type;
a plurality of first mitigation regions having the first conductivity type or the second conductivity type, provided in the first well and being close to the boundary in a lateral direction and penetrating through the first well from an upper side of the first well to reach a lower side of the first well in a vertical direction;
a barrier layer, having the second conductivity type and formed between the first well and substrate to separate the first well and the substrate; and
at least one barrier mitigation region in the barrier layer, the at least one barrier mitigation region being close to the boundary in the lateral direction and penetrating the barrier layer in a vertical direction.

12. A semiconductor device, comprising:
a semiconductor structure, comprising:
a substrate;
a first well having a first conductivity type, provided on the substrate;
a second well having a second conductivity type and contacting the first well at a boundary in between in a lateral direction, the second conductivity type being opposite to the first conductivity type; and
a plurality of mitigation regions having the first conductivity type or the second conductivity type, provided in the first well and being close to the boundary in a lateral direction and penetrating through the first well from an upper side of the first well to reach a lower side of the first well in a vertical direction;
a gate, formed on the first well;
a source and a drain, respectively formed in the first well and at two sides of the gate;
a barrier layer, having the second conductivity type and formed between the first well and the substrate to separate the first well and the substrate; and
at least one barrier mitigation region in the barrier layer, the at least one barrier mitigation region being close to the boundary in the lateral direction and penetrating the barrier layer in a vertical direction.

* * * * *